United States Patent [19]

Tomizawa

[11] Patent Number: 4,990,949
[45] Date of Patent: Feb. 5, 1991

[54] IMAGE RECORDING APPARATUS HAVING A TENSION DEVICE IN THE WIND-UP PATH

[75] Inventor: Takashi Tomizawa, Aichi, Japan

[73] Assignee: Brother Kogyo Kabushiki Kaisha, Aichi, Japan

[21] Appl. No.: 272,259

[22] Filed: Nov. 17, 1988

[30] Foreign Application Priority Data

Nov. 17, 1987 [JP] Japan ............ 62-175162[U]

[51] Int. Cl.⁵ .......................................... G03B 27/72
[52] U.S. Cl. ..................................... 355/27; 242/75.2
[58] Field of Search ..................... 355/27–29; 242/75.2–75.51; 226/195

[56] References Cited

U.S. PATENT DOCUMENTS

| | | | |
|---|---|---|---|
| 4,653,890 | 3/1987 | Nordstrom et al. | 355/27 |
| 4,722,490 | 2/1988 | Doerfel | 242/75.51 |
| 4,783,683 | 11/1988 | Nagumo et al. | 355/27 |

Primary Examiner—L. T. Hix
Assistant Examiner—D. Rutledge
Attorney, Agent, or Firm—Oliff & Berridge

[57] ABSTRACT

In a recording apparatus of the type in which an image of an original is recorded on a recording sheet with the use of an elongated, web-like microcapsule sheet, it is contemplated to tightly wind the exhausted microcapsule sheet around a take-up roller without adversely affecting the formation of a latent image on a microcapsule sheet and/or development of the latent image. To this effect, when the recording operation is not being performed, a particular portion of the exhausted microcapsule sheet is grasped by a grasping unit and the take-up roller winds the exhausted microcapsule sheet while imparting a high tension thereto, whereby a space for accommodating the take-up roller can be made small. During the recording operation, the exhausted microcapsule sheet is free from the grasping force and the sheet is wound around the take-up roller while imparting a low tension thereto.

4 Claims, 2 Drawing Sheets

IMAGE RECORDING APPARATUS HAVING A TENSION DEVICE IN THE WIND-UP PATH

BACKGROUND OF THE INVENTION

The present invention relates generally to a picture image recording apparatus for recording an image of an original on a recording sheet. More particularly, the invention relates to a picture image recording apparatus provided with a device capable of tightly winding exhausted recording medium.

A picture image recording apparatus has been known in which an elongated, web-like continuous recording medium on which a latent image is formed is brought into facial contact with a recording sheet to develop the latent image and provide a visible image on the recording sheet. With this type of picture image recording apparatus, that portion of the elongated recording medium which has undergone a developing process is sequentially wound up and collected by an elongated recording medium cartridge section for its easy disposal after usage. One of the conventional recording medium cartridge sections changes the torque of an electric motor which winds up the elongated recording medium in order to prevent a variation in take-up retention that may result from an increase in diameter of the wound recording medium.

The conventional picture image recording apparatus is provided with the recording medium cartridge section just for the purpose of easy disposal of the recording medium collected in the cartridge section. However, the cartridge section occupies a large space in the recording apparatus, thus resulting in enlargement of the overall apparatus.

With such a recording medium cartridge section designed to change the torque of the motor in order to compensate for the variation in take-up retention, if the elongated recording medium is wound under high tension by increased torque of the motor, the formation of a latent image and a development of the same cannot be performed precisely because feeding of the recording medium is required to be accurate in performing latent image formation and development. The above problem has remained unsolved in the conventional apparatuses.

SUMMARY OF THE INVENTION

Accordingly it is an object of this invention to provide a picture image recording apparatus which can wind up a used elongated recording medium to a significantly small roll without deteriorating the recording accuracy, and can be made compact to facilitate the disposal of the elongated recording medium.

To achieve this and other objects, according to one aspect of this invention, there is provided a picture image recording apparatus for recOrding an image of an original on a first recording medium (100) with the use of second recording medium (200), said second recording medium (200) being in the form of an elongated, web-like continuous sheet, said apparatus comprising:
 means (300) for forming a latent image corresponding to the image of the original on said second recording medium (200);
 means (400) for developing said latent image on said second recording medium (200) and forming a visible image on said first recording medium (100);
 means (500) for finding said second recording medium subjected to latent image development (200'):
 means (600) for grasping a portion of said second recording medium subjected to latent image development (200') with a grasping force of a predetermined value;
 means (700) for actuating said grasping means; and
 means for applying a winding force to said winding means (500) to apply a tension of a predetermined value to said second recording medium subjected to latent image development (200'), said winding force being determined on the basis of said grasping force.

In operation, the grasping means (600) grasps a particular portion of the exhausted second recording medium (200') with the grasping force, and the winding means (500) rotates with a torque corresponding to the grasping force to sequentially wind up the exhausted second recording medium (200') with a particular tension. The tension equal to or greater than a given level is applied to that portion of the second recording medium (200') extending from the grasping means (600) to the winding means (500), so that the diameter of the wound-up recording medium can be made smaller. The large tension exerted by the winding means (500) does not, however, affect that portion of the second recording medium (200) in the side of the developing unit (400), so that, like in the conventional case, a high recording medium feeding accuracy can be maintained as it is necessary for high-quality latent image forming and developing.

DETAILED DESCRIPTION OF THE PREFERRED EMBODIMENT

A preferred embodiment of this invention will be described below with reference to the accompanying drawings.

Figure 1:
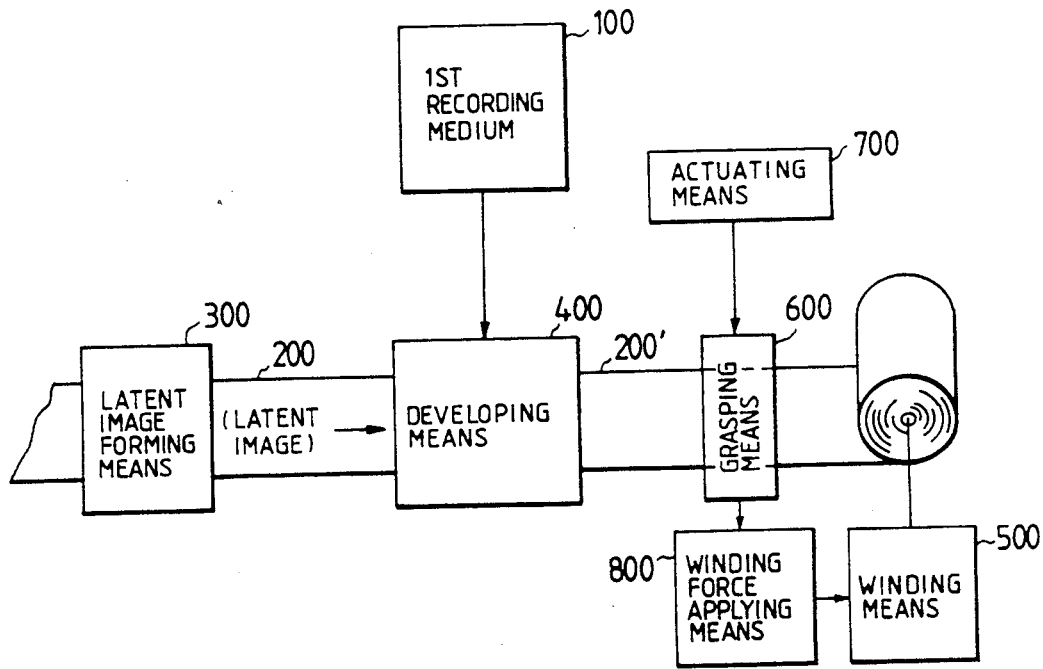
FIG. 1 is a diagram schematically illustrating a structure of an picture image recording apparatus according to this invention.
Figure 2:
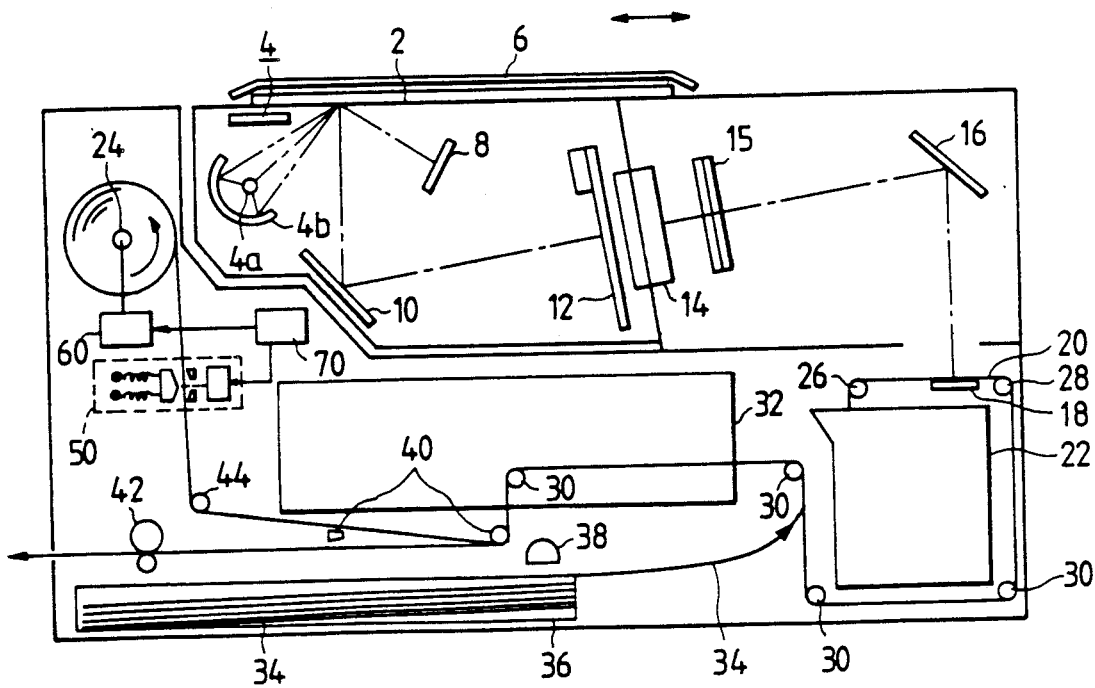
FIG. 2 is a schematic cross-sectional view of a recording machine according to one embodiment of this invention in which a photosensitive pressure sensitive recording medium is used.

FIG. 2 is a schematic cross section of a color image recording apparatus in which a photo-sensitive sheet is used. The photosensitive sheet is made up of a microcapsule sheet and a developer sheet, and details of such sheets are disclosed, for example, in Japanese Laid-Open Patent Publication (Kokai) No. 58-23025, and thus description thereof is omitted herein.

As illustrated, the recording machine has its top plate portion constituted by an original support pane 2 which is made of a transparent glass and is horizontally slidable. An original is placed with its image face down on the original support pane 2. At the upper left section of the recording machine is fixed a light source 4 including a halogen lamp 4a and a reflector 4b having a semi-circular cross-section, both extending in a direction perpendicular to the sheet of drawing. The light source 4 emits light rays onto the original support pane 2. The light emitted from the light source 4 is thus sequentially irradiated onto the entire surface of the original support pane 2 from the leftmost end to the rightmost end as the original support pane 2 slidingly moves in horizontal direction. The light from the light source 4 passes through the original support pane 2 and is reflected from the original placed thereon. In order to prevent a leakage of the reflection light, a lid member 6 is provided to cover the top surface of the original support pane 2. To irradiate the light from the light source 4 on&o the original at a high efficiency, a reflector B is disposed on the right side of the light source 4 to reflect light which does not advance toward the original, so that this light can also be irradiated onto the original.

Light emitted from the light source 4 and then reflected at a given line of the original, which is determined by the sliding position of the original support pane 2, is reflected rightwardly in the recording machine by a reflection mirror 1O that is disposed directly below the given line. The light reflected from the mirror 10 passes through a shutter 12. The shutter 12 is provided to interrupt unwanted reflection light. The light further passes through a focusing lens 14 and a filter 15 for selectively passing light with a predetermined wavelength component (cyan, magenta or yellow) and is then directed downwardly by a reflection mirror 16. The light reflected from the original is thus rendered an orthogonal projection on a microcapsule sheet support stand 18.

A roll of an elongated, web-like continuous microcapsule sheet 20 is retained in a partone or cartridge 22 disposed below the support stand 18, and the sheet 20 withdrawn therefrom ex&ends to a &take-up roller 24 through a number of sheet feed rollers and a pressure developing unit More specifically, the microcapsule sheet 20 fed out from the top portion of the cartridge 22 is led to feed rollers 26 and 28, passing over the support stand 18, and is conveyed around the cartridge 22 into a pressure developing unit 32 by means of other feed rollers 30. The conveying speed of the microcapsule sheet 20 has been determined to be in synchronization with &he sliding speed of the original support pane 2, so that a latent image of a given line of the original is sequentially formed on the microcapsule sheet 20 as the latter passes over the support stand 18.

Below the pressure developing unit 32 is provided a cartridge 36 in which developer sheets 34 in the form of a out sheet are stacked. The developer sheets 34 are fed out one by one to the sheet inlet portion of the pressure developing unit 32 in accordance with rotations of a semi-circular roller 38. The developer sheet 34 and the microcapsule sheet 20 are brought into facial contact with each other, whereupon the two sheets are introduced into the developing unit 32 where the latent image on the microcapsule sheet 20 is developed under pressure and a visible image is formed on the developer sheet 34.

After development, the developer sheet 34 is separated from the microcapsule sheet 20 by a sheet separator 40. The developer sheet 34 is fed to a thermal fixing unit 42 and is discharged out of the recording machine after thermal fixing. The microcapsule sheet 20 passes through a grasping unit 50 through a feed roller 44 and is wound up by the take-up roller 24, which is driven by an electric motor 60. Both of the grasping unit 50 and motor 60 are controlled in response to a drive control signal supplied from an electronic controller 70.

Figure 3:
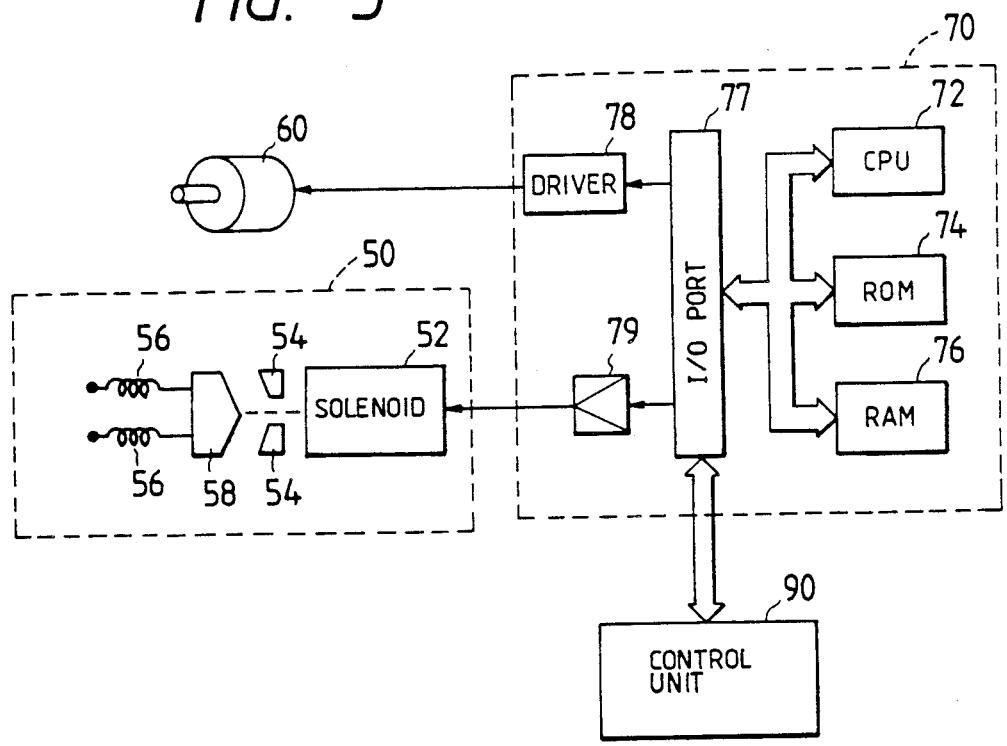
FIG. 3 is a block diagram illustrating a winding mechanism used in the embodiment shown in FIG. 2.

The grasping unit 50 and a motor 60 will be described in detail with reference to FIG. 3. FIG. 3 illustrates an arrangement a control system for controlling the grasping unit 50 and the motor 60. The grasping unit 50 includes a driving solenoid 52 fixedly secured to a main body of the picture image recording apparatus, fixed chips 54 and a movable chip 58 disposed to confront the fixed chips 54 with a given interval and secured to the main body through coil springs 56. The microcapsule sheet 20 having undergone the developing process reaches the take-up roller 24 while passing through a gap between the fixed chips 54 and movable chip 58. The diagram illustrates that the driving solenoid 52 is in a non-excited state, in which the movable chip 58 is in a retracted position with a certain spacing between the fixed chips 54 and the movable chip 58. Therefore, the microcapsule sheet 20 is free from the grasping force and is smoothly wound up by the take-up roller 24. When the driving solenoid 52 is excited, the movable chip 58 is attracted toward the solenoid 52 against the resilient force of the coil springs 56 to be in engagement with the fixed chips 54. In other words, the microcapsule sheet 20 passing between the movable chip 58 and the fixed chips 54 is grasped by both chips 54 and 58, thus inhibiting the take-up roller to wind up the sheet 20. If the take-up roller 24 is rotated, a tension is applied to the microcapsule sheet 20.

The motor 60 for rotating the take-up roller 24 is of a well-known type which generates an output substantially proportional to an input current and it is, like the driving solenoid 52, driven bY the drive control signal from the electronic controller 70.

The electronic controller 70 is a digital logic circuit constituted with a microcomputer as its control center. The controller includes a CPU (central processing unit) 72 for executing logical operations, a ROM (read-only memory) 74 serving as a non-volatile storage for storing various programs including a winding control program (to be described later), a RAM (random access memory) 76 serving as temporary data storage for storing logical operations executed by the CPU 72, and an input/output port 77 which permits data communication between the CPU 72 and various machines (to be described later). A motor driver 78 receives a control signal from the input/output port 77 and sends an armature current corresponding to the control signal to the motor 60 to thereby change the torque of the take-up roller 24 driven by the motor 60. A solenoid driver 79 selectively supplies an excitation current to the driving solenoid 52 in accordance with a control signal from the input/output port 77 to thereby control the grasping of the microcapsule sheet 20. According to this embodiment the effective value of the armature current sent to the motor 60 by the motor driver 78 in accordance with the control signal from the input/output& port 77 takes two changeable values: one being a value IL necessary for winding up the microcapsule sheet 20 as in the prior art and the other being a value IH (IH>IL) for causing the take-up roller 24 to generate a high torque. Signal lines of another control unit 90 that also constitutes the picture image recording apparatus are coupled to the input/output port 77 and signals representing the operational statues of the control unit 90 are inputted to the input/output port 77.

With the picture image recording apparatus thus arranged, the winding program (see FIG. 4) stored in the ROM 74 of the electronic controller 70 is executed, and the grasping unit 50 and mo&or 60 function as follows.

Figure 4:
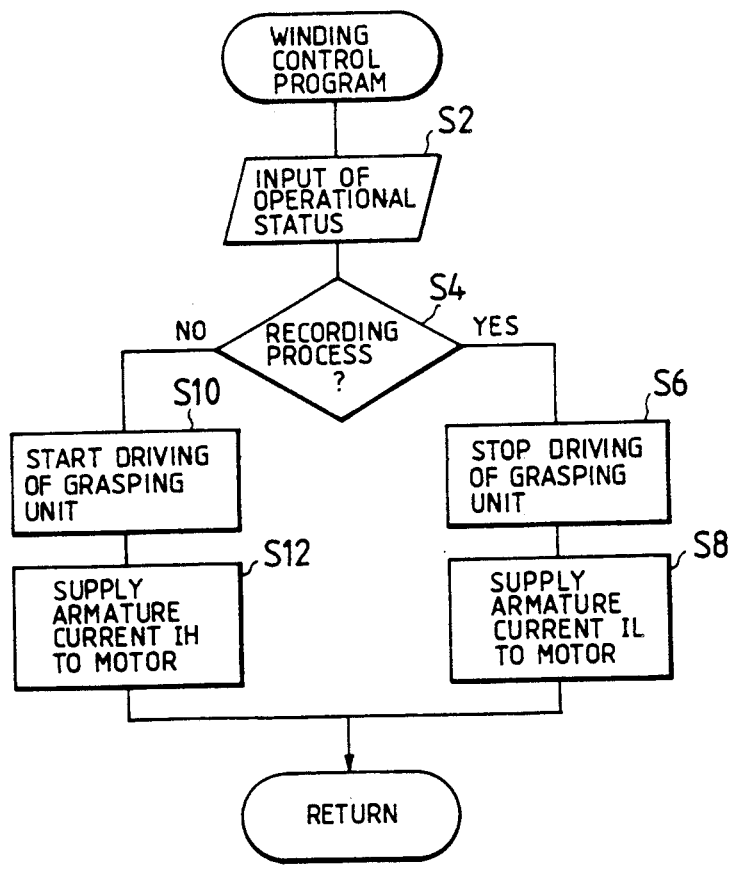
FIG. 4 is a flowchart for a winding control program executed in this embodiment.

The winding program of FIG. 4 is repeatedly executed for every predetermined period by the CPU 72 after the main power of the X is turned on. First an operational status of the control unit 90 is inputted step S2) and based on the input data it is checked whether or not a recording process is presently being executed (step S4). If, for example, the original support pane 2 is being in a sliding motion which represents that the recording operation is being performed, the supply of the excitation current to the driving solenoid 52 is stopped (step S6) in order to inhibit the grasping unit 50 from grasping the microcapsule sheet 20, and the armature current IL is supplied to the motor 60 (step S8). In other words, at this time the grasping unit 50 is not operated and the microcapsule sheet 20 is wound with weak tension by the take-up roller 24 generating a low torque.

If, in step S4, it is checked so that the recording process is not being carried out, the excitation current is supplied to the driving solenoid 52 to cause the grasping unit 50 to grasp the microcapsule sheet 20 with a given force (step S10) and the armature current IH is supplied to the motor 60 to execute the winding operation with high torque (step S12). In other words, at this time, the grasping unit 50 grasps the microcapsule sheet 20 to inhibit the winding operation and the take-up roller 24 is driven with a stronger force than that needed for the normal winding operation to wind up the microcapsule sheet 20.

The picture image recording apparatus of this invention constituted in the above manner produces the following effects.

In executing the normal recording operation, the grasping unit 50 is not operated in any way, and the motor 60 driven by the armature current IL rotates the take-up roller 24 with the same output power as is in the case of the prior art. Accordingly, the accuracy in feeding the microcapsule sheet 20 is not influenced at all in the processes of forming a latent image on the sheet 20 in the support stand 18 and developing the image in the pressure developing unit 32, thereby ensuring a high-quality recording.

When the picture image recording apparatus is not in the course of the recording operation, the grasping unit 50 is operated in which the large armature current IH is supplied to the motor 60. Although the microcapsule sheet 20 is grasped by the grasping unit 50 and thus the same is held unmovable, the take-up roller 24 operates to wind up the microcapsule sheet 20 with a high tension. Consequently, the microcapsule sheet 20 loosely wound to have a large diameter is tightened with a large force by the take-up roller 24 so as to reduce the diameter of the roll of the microcapsule sheet 20. This tightening does not adversely affect the recording operation. The diameter of the roll of the used micro-capsule sheet 20 becomes significantly small, and the space to be reserved around the take-up roller 24 can be made small. Thus, the space for accommodating the roll of the used microcapsule sheet 20 within the picture image recording apparatus can be made small, and accordingly the size of the overall apparatus can be made in compact and the disposal of the used microcapsule sheet 20 is facilitated. In addition, sInce the above winding process is executed at an interval between recording operations, no adverse influence is exerted to the accurate feeding of the micro-capsule sheet 20, thus maintaining the high-quality recording.

It should be noted that this invention is in no way restricted to the above particular embodiment, but can be modified in various manners within the scope and spirit of the invention. For instance, although the output of the motor 60 is varied only in two stages in the above embodiment, it may be varied in multistages in accordance with the diameter of the wound-up roll of the microcapsule sheet 20. In &his way, the microcapsule sheet 20 can be wound up more uniformly and its roll diameter can be made smaller.

What is claimed is:

1. A picture image recording apparatus for recording an image of an original on a first recording medium with the use of a second recording medium, said second recording medium being in the form of an elongated, web-like continuous sheet, said apparatus comprising:
   means for forming a latent image corresponding to the image of the original on said second recording medium;
   means for developing said latent image on said second recording medium and forming a visible!e image on said first recording medium;
   means for winding said second recording medium subjected to latent image development;
   means for grasping a portion of said second recording medium subjected to latent image development with a grasping force of a predetermined value;
   means for actuating said grasping means; and
   means for applying a winding force to said winding means to apply a tension of a predetermined value to said second recording medium subjected to latent image development, said winding force being determined on the basis of said grasping force.

2. A picture image recording apparatus according to claim 1, wherein said actuating means disables said grasping means so that said second recording medium subjected to latent image development is released from the grasping force.

3. A picture image recording apparatus according to claim 2, wherein said winding force applying means selectively applies a first tension of a first value and a second tension of a second value, wherein said first value is greater than said second value and said first tension is applied to said second recording medium subjected to latent image development when the latter is being grasped by said grasping means.

4. A picture image recording apparatus according to claim 3, therein said grasping means comprises an electromagnet member fixedly secured to a first position, said electromagnet member being adapted to produce an attracting force in a first direction; a first grasping member fixedly secured to a second position; a second grasping member disposed in a third position to confront said first grasping member with a predetermined distance between said second and said third positions, said second grasping member being engageable with said first grasping member when said second grasping member is attracted by said electromagnet member; and a resilient member having a first end coupled to said second grasping member and a second end fixedly coupled to said apparatus, said resilient member attracting said second grasping member in a second direction opposite to said first direction, wherein said second recording medium subjected to latent image development is grasped by said grasping means when said second grasping member engages said first grasping member.

* * * * *